United States Patent
Hata et al.

(10) Patent No.: US 6,794,685 B2
(45) Date of Patent: Sep. 21, 2004

(54) NITRIDE SEMICONDUCTOR LIGHT EMITTING DEVICE AND MANUFACTURING METHOD THEREOF

(75) Inventors: Toshio Hata, Nara (JP); Mayuko Fudeta, Mihara (JP); Daigaku Kimura, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/237,468

(22) Filed: Sep. 6, 2002

(65) Prior Publication Data
US 2003/0047741 A1 Mar. 13, 2003

(30) Foreign Application Priority Data

Sep. 7, 2001 (JP) ........................................ 2001-272014

(51) Int. Cl.[7] ............................................. H01L 27/15
(52) U.S. Cl. ........................... 257/79; 257/13; 257/82; 257/89; 257/93; 257/98; 257/99; 257/103
(58) Field of Search .......................... 257/13, 79, 82, 257/89, 93, 98, 99, 103, 918, 80

(56) References Cited

U.S. PATENT DOCUMENTS 5,854,088 A * 12/1998 Plais et al. ................... 438/39
5,905,275 A * 5/1999 Nunoue et al. ............... 257/95
6,178,190 B1 * 1/2001 Naniwae et al. .............. 372/45
6,239,033 B1 * 5/2001 Kawai .......................... 438/693
6,606,333 B2 * 8/2003 Kadota ......................... 372/45

FOREIGN PATENT DOCUMENTS

JP         2001007395 A         1/2001

OTHER PUBLICATIONS

Patent Abstracts of Japan of Publication No. 2001007395 A published on Jan. 12, 2001.

* cited by examiner

*Primary Examiner*—Long Pham
*Assistant Examiner*—Wai-Sing Louie
(74) *Attorney, Agent, or Firm*—Morrison & Foerster LLP

(57) ABSTRACT

The light emitting device includes a p type nitride semiconductor layer, a light emitting layer and an n type nitride semiconductor layer stacked on an Si (silicon) substrate in this order from the side of the Si substrate. The Si substrate is partially removed to expose a part of the p type nitride semiconductor layer. On the exposed region of the p type nitride semiconductor layer, a p type electrode is formed.

12 Claims, 7 Drawing Sheets

NITRIDE SEMICONDUCTOR LIGHT EMITTING DEVICE AND MANUFACTURING METHOD THEREOF

BACKGROUND OF THE INVENTION

1. Field of the Invention

The present invention relates to a nitride semiconductor light emitting device capable of emitting light in blue to ultraviolet regions and, more specifically, to a structure of a nitride semiconductor light emitting device using an Si substrate.

2. Description of the Background Art

Conventionally, it has been known that a nitride semiconductor light emitting device may be used as a blue light emitting device. Recently, blue light emitting diodes and violet semiconductor laser have been studied. FIG. 11 shows a schematic structure of a nitride semiconductor light emitting device disclosed in Japanese Patent Laying-Open No. 2001-7395. The nitride semiconductor light emitting device has such a structure in that on an Si substrate 100, a lower clad layer 200 of an n type nitride semiconductor, a light emitting layer 300 and an upper clad layer 400 of a p type nitride semiconductor are stacked in this order, with a p type ohmic electrode 500 formed on upper clad layer 400 and an n type ohmic electrode 600 formed on Si substrate 100.

Consider the structure of the nitride semiconductor light emitting device disclosed in Japanese Patent Laying-Open No. 2001-7395 in which an n type nitride semiconductor layer and a p type nitride semiconductor layer are stacked successively on Si substrate. When a current blocking structure or a current constricting structure is to be formed in order to improve light emitting efficiency in the light emitting device, it is necessary to form an insulating film or a current blocking film, on a p type nitride semiconductor layer, which is doped with Mg (magnesium), thin and has high resistivity.

Therefore, conventionally, the p type nitride semiconductor layer is damaged when the insulating film or the current blocking film is formed, resulting in crystal defects generated in the p type nitride semiconductor layer, which crystal defects capture Mg. Further, in most cases, the insulating film contains oxygen, and the oxygen introduced to the surface and to the inside of the p type nitride semiconductor layer oxidizes Mg. Therefore, concentration of Mg as the impurity in the p type nitride semiconductor layer decreases, further increasing the resistivity and deteriorating characteristics of the light emitting device.

Further, when the insulating film or the current blocking film is to be formed on the p type nitride semiconductor layer as described above, the step of fabrication of such a film is necessary.

Because of these problems, it has been difficult to form a current blocking structure or a current constricting structure in the light emitting device.

SUMMARY OF THE INVENTION

In view of the foregoing, an object of the present invention is to fabricate a current blocking structure or a current constricting structure easily in a light emitting device, and to fabricate a highly reliable nitride light emitting device.

The above described object can be attained by the nitride semiconductor light emitting device in accordance with the present invention that includes a p type nitride semiconductor layer, a light emitting layer and an n type nitride semiconductor layer stacked on an Si (silicon) substrate in this order from the Si substrate, wherein the Si substrate is partially removed to expose a part of the p type nitride semiconductor layer, and on the exposed region of p type nitride semiconductor layer, a p type electrode is formed.

In the nitride semiconductor light emitting device of the present invention, an n type pad electrode may be formed at a corner on the surface of the n type nitride semiconductor layer.

In the nitride semiconductor light emitting device of the present invention, the p type nitride semiconductor layer may include a region having high dopant concentration and a region having low dopant concentration.

In the nitride semiconductor light emitting device of the present invention, the backside of the Si substrate opposite to the surface having the stack formed thereon is partially removed to have a recessed or protruded shape, and the surface of the p type nitride semiconductor layer may be exposed at the removed region.

In the nitride semiconductor light emitting device of the present invention, when the back side of Si substrate opposite to the surface having the stack formed thereon is partially removed to have a recessed shape, a reflective film is formed at the recessed portion.

Further, in the nitride semiconductor light emitting device of the present invention, when the backside of the Si substrate opposite to the surface having the stack formed thereon is partially removed to have a protruded shape, the n type nitride semiconductor layer may be formed to have a protruded shape. Further, in this case, an n type pad electrode, or an n type pad electrode and an n type light emitting electrode may be formed at the top of the protruding portion of n type nitride semiconductor layer.

In the nitride semiconductor light emitting device of the present invention, that region of the p type nitride semiconductor layer which is positioned on the region where the Si substrate is removed may have higher dopant concentration than other regions of the p type nitride semiconductor layer.

In the nitride semiconductor light emitting device of the present invention, the Si substrate is non-conductive, and it may be non-light transmitting.

Further, the present invention provides a method of manufacturing a nitride semiconductor light emitting device, including the steps of stacking a p type nitride semiconductor layer, a light emitting layer and an n type nitride semiconductor layer in this order on an Si substrate to form a stacked body; removing a part of the Si substrate; exposing the surface of the p type nitride semiconductor layer from the portion where the Si substrate is removed; heat-treating the stacked body with part of the Si substrate removed; and forming a p type electrode on the exposed surface of the p type nitride semiconductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detail in the following. It is noted, however, that the present invention is not limited to these embodiments.

First Embodiment

Figure 1:
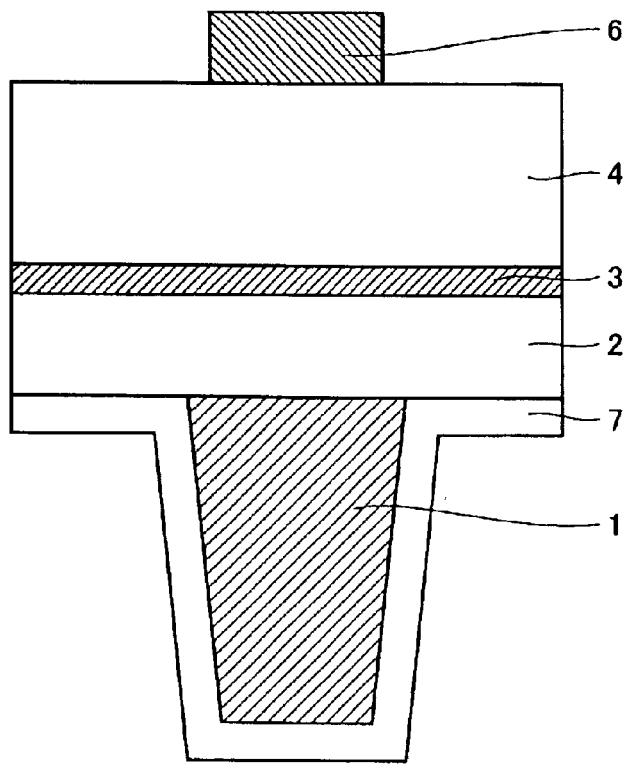
FIGS. 1 to 8 are schematic cross sections of the nitride semiconductor light emitting device fabricated in accordance with first to eighth embodiments of the present invention.

FIG. 1 shows a structure of a nitride semiconductor light emitting device in accordance with the first embodiment, in which a p type nitride semiconductor layer 2 doped with Mg, a light emitting layer 3 and an n type nitride semiconductor layer 4 are stacked in this order on a non-conductive substrate 1 of Si. On the back surface of non-conductive substrate 1 opposite to the surface having the stack formed thereon, the non-conductive substrate 1 is formed to have a protruded shape. On surfaces of the protruded non-conductive substrate 1 and p type nitride semiconductor layer 2, a p type electrode 7 is formed. Approximately at the center of the surface of n type nitride semiconductor layer 4, an n type pad electrode 6 is formed.

When the nitride semiconductor light emitting device shown in FIG. 1 is fabricated, first, the non-conductive substrate 1 is set in a growth apparatus for MOCVD (Metal Organic Chemical Vapor Deposition), for example, and p type nitride semiconductor layer 2, light emitting layer 3 and n type nitride semiconductor layer 4 are stacked on the non-conductive substrate 1 successively.

Thereafter, the stacked body is taken out from the apparatus, and an unnecessary portion of non-conductive substrate 1 is removed by using a hydrogen fluoride based etchant, so as to process non-conductive substrate 1 to have a protruded shape. Here, the diameter at the root of the protruding portion is set to 150 μm.

Thereafter, n type pad electrode 6 and p type electrode 7 are formed. The n type pad electrode 6 is formed by stacking a Hf (hafnium) layer having the thickness of 10 nm and an Al (aluminum) layer having the thickness of 1000 nm thereon, approximately at the center on the surface of n type nitride semiconductor layer 4. The p type electrode 7 is formed by stacking a Pd (palladium) layer having the thickness of 20 nm and an Au (gold) layer having the thickness of 1000 nm thereon, to cover the surfaces of the protruded non-conductive substrate 1 and p type nitride semiconductor layer 2.

Thereafter, the light emitting devices fabricated in the above described manner are divided into rectangles each of 300 μm square. Each of the thus obtained light emitting devices is mounted on a lead frame, with the p type electrode 7 facing the bottom portion of a cup.

Figure 9A:
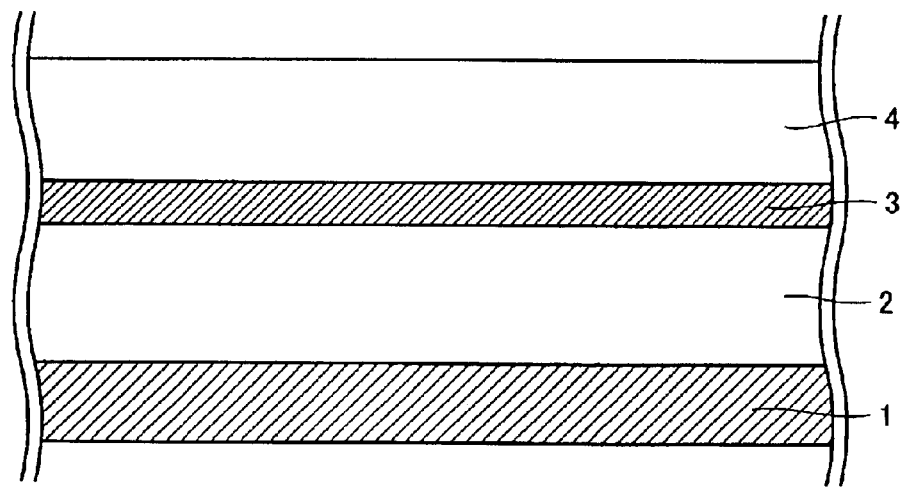
FIG. 9A is a schematic cross section of the nitride semiconductor stacked body in accordance with the first to eighth embodiments of the present invention.
Figure 9B:
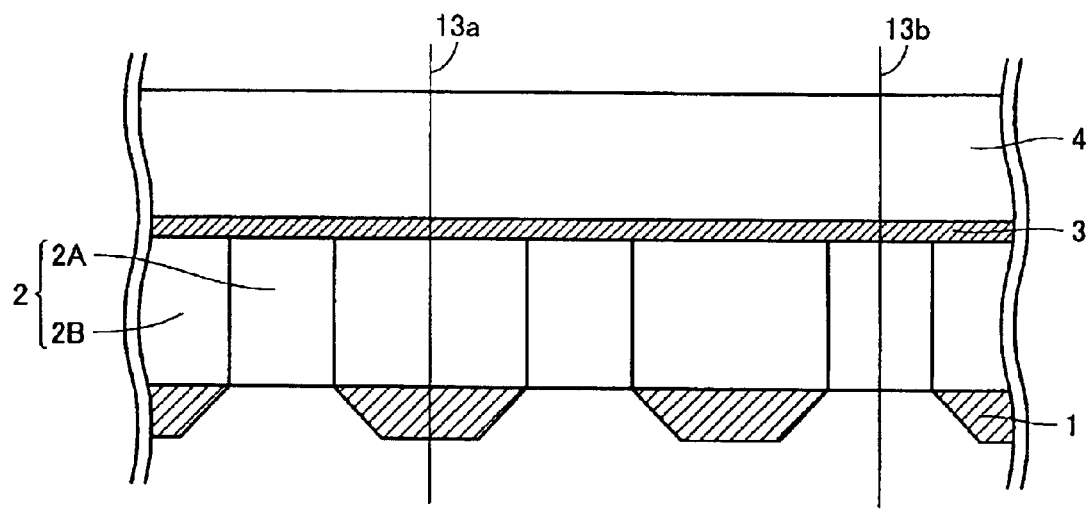
FIG. 9B represents dividing lines for fabricating the nitride semiconductor stacked body of the first to eighth embodiments.

FIG. 9A schematically shows the stacked body of the nitride semiconductor in accordance with the present invention. FIG. 9B shows a dividing line 13b for dividing the nitride semiconductor light emitting devices in accordance with the present invention.

The nitride semiconductor light emitting device in accordance with the first embodiment fabricated in the above described manner is fabricated not by stacking an n type nitride semiconductor layer 4 on the non-conductive substrate 1 as in the prior art, but fabricated by stacking a p type nitride semiconductor layer 2. Therefore, different from the prior art, it is unnecessary to newly form an insulating film or the like on p type nitride semiconductor layer 2. Therefore, the crystal defects in p type nitride semiconductor layer 2 generated when the insulating film or the like is formed can be reduced. Therefore, diffusion of Mg doped in p type nitride semiconductor layer 2 to the light emitting layer at the time of conduction can be suppressed, and hence a nitride semiconductor light emitting device having superior reliability can be fabricated.

Further, as the substrate 1 is non-conductive, the amount of current flowing to the semiconductor region stacked on that portion where substrate 1 has been removed becomes larger than the amount of current flowing to the semiconductor region stacked on the portion where the substrate is not removed, when current is introduced from the outside to the light emitting device. Therefore, the semiconductor region through which the current flows can be biased. Therefore, it is unnecessary to newly provide a current blocking structure or a current constricting structure.

Second Embodiment

Figure 2:
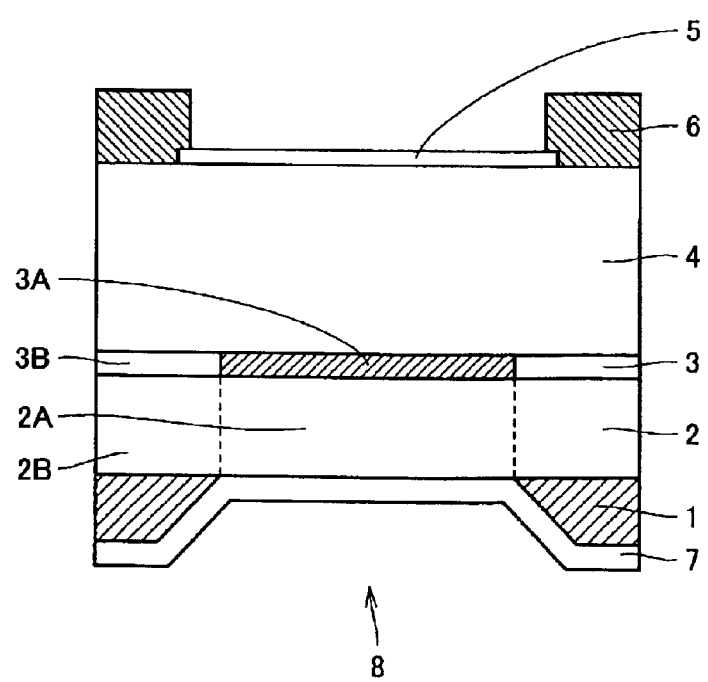

In the structure of the nitride semiconductor light emitting device in accordance with the second embodiment shown in FIG. 2, a p type nitride semiconductor layer 2, a light emitting layer 3 and an n type nitride semiconductor layer 4 are stacked in this order on a non-conductive substrate 1 of Si. On the backside of non-conductive substrate 1 opposite to the surface having the stack formed thereon, the non-conductive substrate 1 is formed to have a recessed shape, and there is an opening 8 at the portion where non-conductive substrate 1 is removed. Further, on the surfaces of non-conductive substrate 1 and p type nitride semiconductor layer 2, a p type electrode 7 is formed, and an n type pad electrode 6 is formed at a corner on the surface of n type nitride semiconductor layer 4.

Figure 10A:
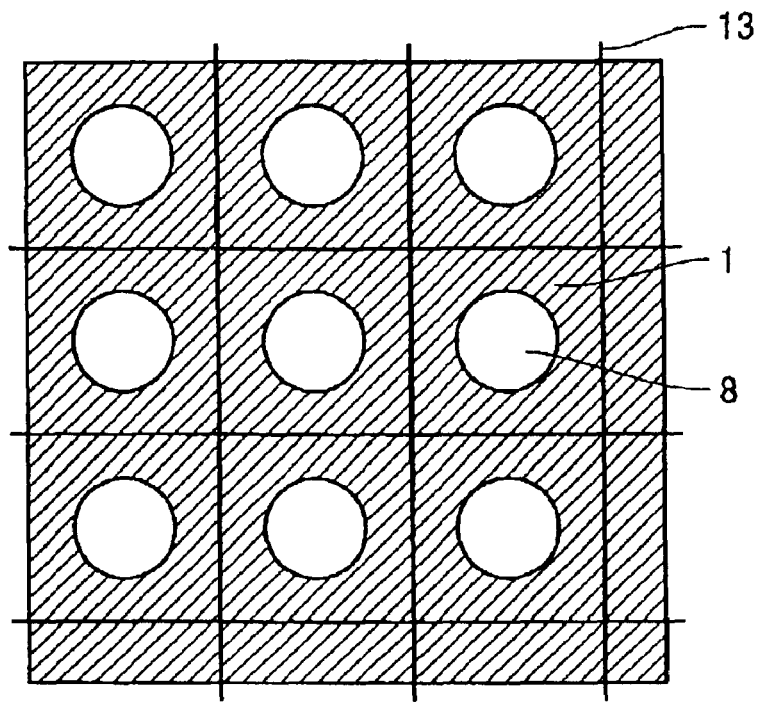
FIGS. 10A and 10B represent schematic back surface of the substrate of the nitride semiconductor light emitting device in accordance with the first to eighth embodiments of the present invention.

FIG. 10A shows the shape of the back surface of non-conductive substrate 1 of the nitride semiconductor light emitting device in accordance with the present embodiment. Referring to FIG. 10A, there are openings 8 on the back surface of non-conductive substrate 1, and along dividing lines 13, the wafer is cut into chips (semiconductor light emitting devices).

When the nitride semiconductor light emitting device shown in FIG. 2 is to be fabricated, first, the non-conductive substrate 1 is set in a growth apparatus for MOCVD, for example, and p type nitride semiconductor layer 2 doped with Mg, light emitting layer 3 and n type nitride semiconductor layer 4 are stacked on the non-conductive substrate 1 successively.

Thereafter, the stacked body is taken out from the apparatus, unnecessary portion of non-conductive substrate 1 is removed by using a hydrogen fluoride based etchant, and a recessed opening 8 is formed. Here, the diameter of the recessed opening 8 is set to 150 μm.

Thereafter, the stacked body is introduced into a heat treatment furnace, the stacked body is placed on a susceptor of the heat treatment furnace with the side of non-conductive substrate 1 facing upward, and the stacked body is held in a nitrogen atmosphere at 800° C. for 5 minutes for heat treatment.

Thereafter, the stacked body is taken out from the heat treatment furnace, and n type light transmitting electrode 5, n type pad electrode 6 and p type electrode 7 are formed. The n type light transmitting electrode 5 is formed by forming an ITO (Sn added $In_2O_3$) to the thickness of 100 nm on the surface of n type nitride semiconductor layer 4. The n type pad electrode 6 is formed by stacking a Hf layer having the thickness of 20 nm and further an Au layer having the thickness of 1000 nm thereon, at opposing ends on the surface of n type nitride semiconductor layer 4. The p type electrode 7 is fabricated by stacking a Pd layer having the thickness of 20 nm and an Au layer having the thickness of 1000 nm thereon, on the surfaces of non-conductive substrate 1 and p type nitride semiconductor layer 2.

The light emitting devices fabricated in this manner are divided into rectangles each of 300 μm square as shown in FIG. 10A, and the devices are each mounted on a lead frame with the side of p type electrode 7 facing the bottom portion of the cup.

FIG. 9A is a schematic cross section of the stacked body of the light emitting devices fabricated in the above described manner, and FIG. 9B represent dividing line 13a for dividing and fabricating each light emitting device.

Referring to FIG. 2, in the light emitting device of the present embodiment, as the stacked body is heat-treated in the above described manner, the p type nitride semiconductor layer 2 comes to have a region 2A having high concentration and a region 2B having low concentration of Mg doped in p type nitride semiconductor layer 2. The reason for this is that Si in non-conductive substrate 1 enters the p type nitride semiconductor layer 2 to compensate for p type dopant and further that, when Mg is bonded to H (hydrogen) during crystal growth and non-conductive substrate 1 exists on p type nitride semiconductor layer 2, H cannot go outside the p type nitride semiconductor layer 2 even after heat treatment, and therefore, at that region of p type nitride semiconductor layer 2 which corresponds to the region where non-conductive substrate 1 exists comes to have high resistivity. Therefore, in region 2A, the resistivity becomes 2 to 6 Ωcm, that is, lower than in region 2B of which resistivity is $10^6$ Ωcm.

Further, as the substrate is non-conductive, the amount of current flowing to the region 2A stacked on the portion where the substrate is removed becomes larger than the amount of current flowing to region 2B stacked on the portion where the substrate is not removed, when the current is introduced from the outside to the light emitting device.

Therefore, the current introduced to the light emitting device is concentrated at light emitting layer 3A positioned on the region 2A, and the current hardly flows to the light emitting layer 3B positioned on the region 2B. Therefore, the light emitting device can exhibit current constricted type light emitting characteristic.

Therefore, light emitting layer 3B positioned above non-conductive substrate 1 that absorbs the light generated by the light emitting device hardly emits light in the light emitting device of the present embodiment. Therefore, as compared with the prior art, efficiency of light emission to the outside of the light emitting device can be improved.

Third Embodiment

Figure 3:
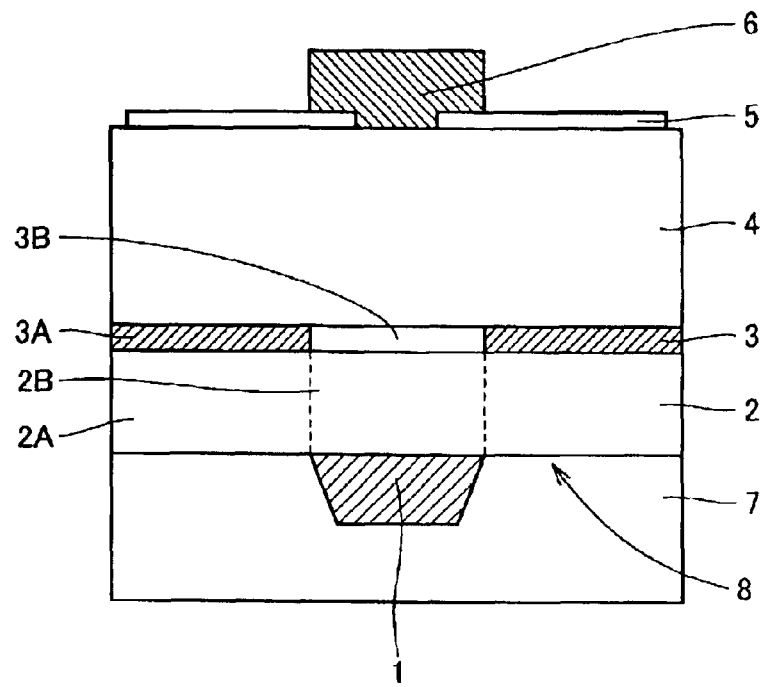

In the structure of the nitride semiconductor light emitting device in accordance with the third embodiment shown in FIG. 3, a p type nitride semiconductor layer 2 doped with Mg, a light emitting layer 3 and an n type nitride semiconductor layer 4 are stacked in this order on a non-conductive substrate 1 of Si. The back surface of non-conductive substrate 1 opposite to the surface having the stack formed thereon is formed to have a protruded shape. There is an opening 8 where non-conductive substrate 1 is removed. On the surfaces of protruded non-conductive substrate 1 and p type nitride semiconductor layer 2, a p type electrode 7 is formed. An n type light transmitting electrode 5 is formed approximately on the entire surface of n type nitride semiconductor layer 4, and an n type pad electrode 6 is formed approximately at the center of the surface of n type nitride semiconductor layer 4.

Figure 10B:
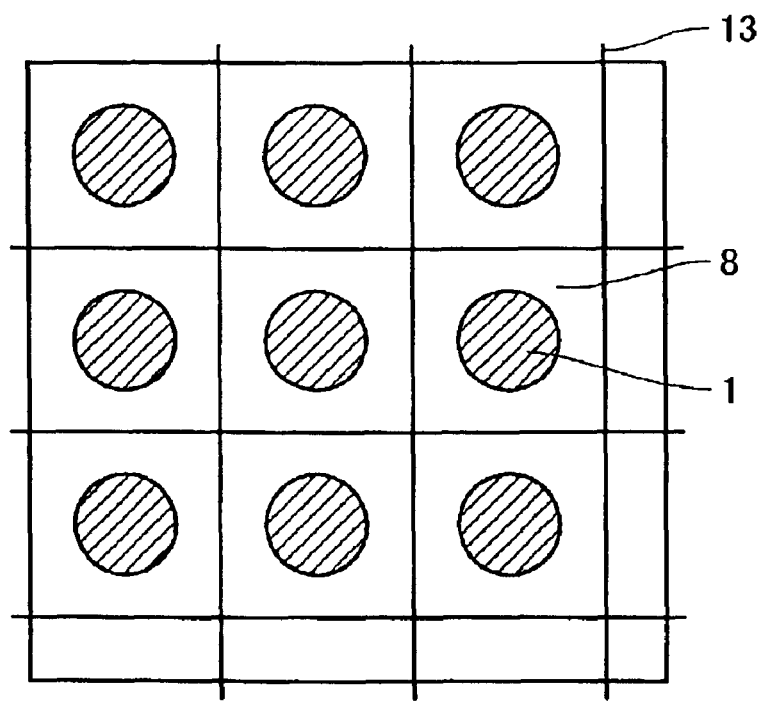
Figure 11:
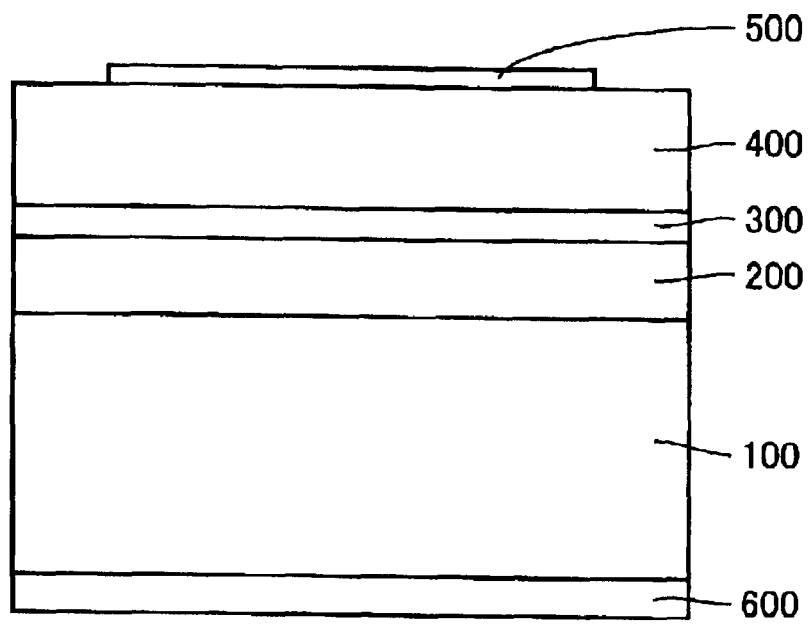
FIG. 11 is a schematic cross section of the nitride semiconductor light emitting device disclosed in Japanese Patent Laying-Open No. 2001-7395.

FIG. 10B shows the shape of the back surface of non-conductive substrate 1, of the nitride semiconductor light emitting devices in accordance with the present embodiment. Referring to FIG. 10B, there are openings 8 on the side of the back surface of non-conductive substrate 1, and the wafer is divided into chips (semiconductor light emitting devices) along dividing lines 13.

When the nitride semiconductor light emitting device of FIG. 3 is to be fabricated, first, non-conductive substrate 1 is set in a growth apparatus for MOCVD, for example, and p type nitride semiconductor layer 2, light emitting layer 3 and n type nitride semiconductor layer 4 are stacked on the non-conductive substrate 1 successively.

Thereafter, the stacked body is taken out from the apparatus, and an unnecessary portion of non-conductive substrate 1 is removed by using a hydrogen fluoride based etchant, so that the substrate 1 is processed to have a protruded shape. Here, the diameter of the protruded portion of non-conductive substrate 1 is set to 150 μm.

Thereafter, the stacked body is introduced to a heat treatment furnace, the stacked body is placed on a susceptor of the heat treatment furnace with the side of non-conductive substrate 1 facing upward, and the stacked body is held in a nitrogen atmosphere at 800° C. for 2 minutes for heat treatment.

Thereafter, the stacked body is taken out from the heat treatment furnace, and n type light transmitting electrode 5, n type pad electrode 6 and p type electrode 7 are formed. The n type light transmitting electrode 5 is fabricated by forming ITO to the thickness of 50 nm on the surface of n type nitride semiconductor layer 4. The n type pad electrode 6 is fabricated by forming an Au layer having the thickness of 1500 nm approximately at the center of the surface of n type nitride semiconductor layer 4. The p type electrode 7 is fabricated by stacking a Pd layer having the thickness of 50 nm and further an Au layer having the thickness of 2000 nm thereon, to cover the surfaces of the protruded non-conductive substrate 1 and p type nitride semiconductor layer 2.

Thereafter, the light emitting devices fabricated in the above described manner are divided into rectangles each of 300 μm square along the dividing lines 13 as shown in FIG. 10B. Each of the resulting light emitting devices is mounted on a lead frame with the side of p type electrode 7 facing the bottom portion of the cup.

FIG. 9A schematically shows the cross section of the stacked body of the light emitting device fabricated in the above described manner, and FIG. 9B shows the dividing line 13b for dividing and fabricating the light emitting devices.

Referring to FIG. 3, the stacked body of the light emitting device in accordance with the present embodiment is also subjected to heat treatment, and therefore, p type semiconductor layer 2 comes to have a region 2A having high concentration and a region 2B having low concentration of Mg doped in p type semiconductor layer 2.

Further, as substrate 1 is non-conductive, the amount of current flowing to a region 2A can be larger than the amount of current flowing to region 2B.

Therefore, the current introduced to the light emitting device is concentrated at light emitting layer 3A positioned on region 2A, and the current hardly flows to light emitting layer 3B positioned on region 2B. Thus, the light emitting device can exhibit the current blocking type light emitting characteristic.

Therefore, in the light emitting device in accordance with the present embodiment, the light emitting layer 3B positioned above non-conductive substrate 1 that absorbs the light generated by the light emitting device hardly emits light. Therefore, as compared with the prior art, the efficiency of light emission to the outside of the light emitting device can be improved.

Fourth Embodiment

Figure 4:
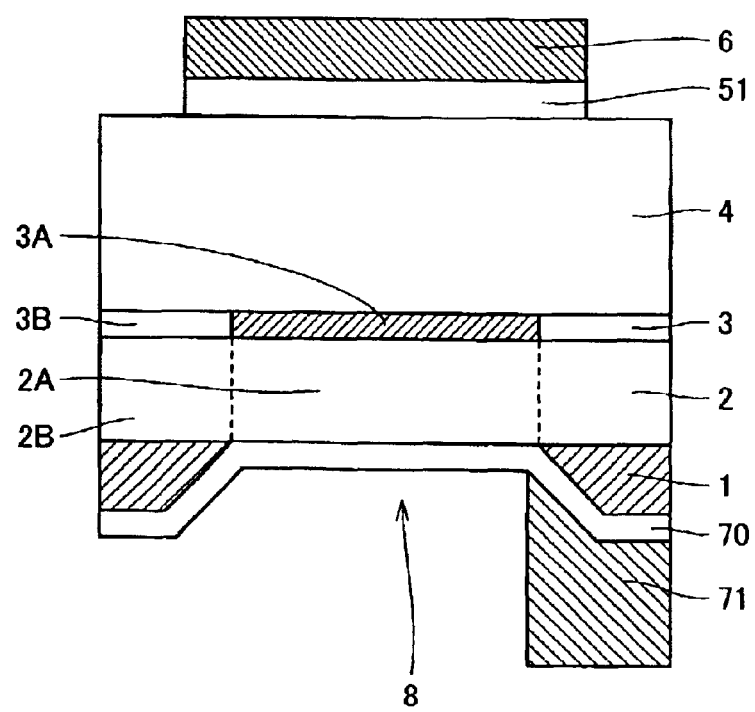

In the structure of the nitride semiconductor light emitting device in accordance with the fourth embodiment shown in FIG. 4, a p type nitride semiconductor layer 2 doped with Mg, a light emitting layer 3 and an n type nitride semiconductor layer 4 are stacked in this order on a non-conductive substrate 1 of Si. There is an opening 8 where the non-conductive substrate 1 is removed. Further, on surfaces of non-conductive substrate 1 and p type nitride semiconductor layer 2, a p type light transmitting electrode 70 is formed. At a corner of p type light transmitting electrode 70, a p type pad electrode 71 is formed. A reflecting electrode 51 serving as a reflective layer is formed approximately on the entire surface of n type nitride semiconductor layer 4, and an n type pad electrode 6 is formed on reflecting electrode 51.

Here, the p type light transmitting electrode 70 formed on the surfaces of non-conductive substrate 1 and p type nitride semiconductor layer 2 is a Pd thin film having the thickness of 5 nm. The reflecting electrode 51 may be formed by stacking a Hf layer having the thickness of 50 nm and further an Al layer having the thickness of 2000 nm thereon.

The nitride semiconductor light emitting device shown in FIG. 4 may be fabricated in the similar manner as the second embodiment.

Referring to FIG. 4, the light emitting device in accordance with the present embodiment is also subjected to heat treatment of the stacked body. Therefore, the p type nitride semiconductor layer 2 comes to have a region 2A having high concentration and a region 2B having low concentration of Mg doped in p type nitride semiconductor layer 2.

Further, as substrate 1 is non-conductive, the amount of current flowing to region 2A can be larger than the amount of current flowing to region 2B.

Therefore, the current introduced to the light emitting device concentrates at the light emitting layer 3A positioned on region 2A, and the current hardly flows to light emitting layer 3B positioned on region 2B. Therefore, the light emitting device can exhibit the current constricting type light emitting characteristic.

Further, in the present embodiment, the device is mounted on the lead frame with the side of n type pad electrode 6 facing the bottom portion of the cup. Thus, the generated light is reflected by reflecting electrode 51 positioned above light emitting layer 3A, so that the emitted light can further be drawn to the outside of the light emitting device through opening 8 with a Pd thin film provided thereon. Therefore, the efficiency of light emission to the outside can be improved by the present embodiment, as compared with the second embodiment.

Fifth Embodiment

Figure 5:
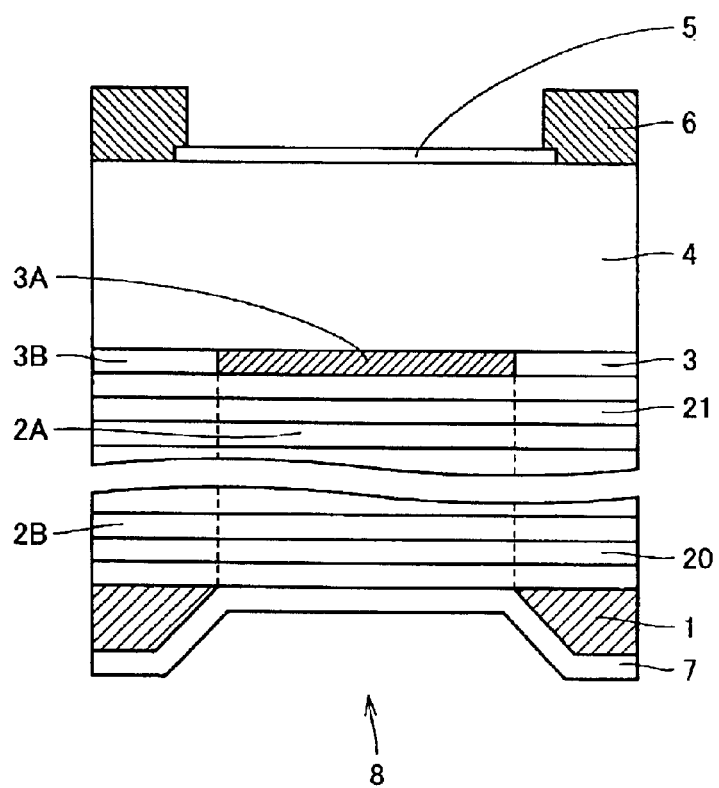

The structure of the nitride semiconductor light emitting device in accordance with the fifth embodiment shown in FIG. 5, a multi-layered stacked body including p type nitride semiconductor layers 20 and 21 doped with Mg, a light emitting layer 3 and an n type nitride semiconductor layer 4 are stacked in this order on non-conductive substrate 1 of Si. There is an opening 8 where non-conductive substrate 1 is removed. Further, on surfaces of non-conductive substrate 1 and the multi-layered stacked body, a p type electrode 7 is formed. Further, an n type light transmitting electrode 5 is formed approximately on the entire surface of n type nitride semiconductor layer 4, and n type pad electrodes 6 are formed at opposing end portions on the surface of n type nitride semiconductor layer 4.

The nitride semiconductor light emitting device shown in FIG. 5 may be fabricated in the similar manner as the second embodiment.

Referring to FIG. 5, the light emitting device of the present invention is also subjected to the heat treatment of the stacked body. Therefore, the multi-layered stacked body including p type nitride semiconductor layers 20 and 21 comes to have a region 2A having high concentration and a region 2B having low concentration of Mg doped in the multi-layered stacked body including p type nitride semiconductor layers 20 and 21.

Further, as substrate 1 is non-conductive, the amount current flowing to region 2A can be larger than the amount of current flowing to region 2B.

Therefore, the current introduced to the light emitting device is concentrated at the light emitting layer 3A positioned on region 2A of multi-layered stacked body including p type nitride semiconductor layers 20 and 21. The current hardly flows to the light emitting layer 3B positioned on region 2B. Thus, the light emitting device can exhibit the current constricting type light emitting characteristic.

Further, in the present embodiment, the multi-layered staked body including p type nitride semiconductor layers 20 and 21 is a multi-layered film of nitride semiconductor formed of 42 layers of a composite comprising a GaN layer 20 and $Al_{0.34}Ga_{0.66}N$ layer 21. The thickness of the film is an integer multiple of ¼ of the light emission wavelength.

Therefore, the multi-layered stacked body including the aforementioned p type nitride semiconductor layers 20 and 21 functions as a reflective layer in the present embodiment, and reflects the emitted light above the light emitting device. Therefore, the light that proceeds to non-conductive substrate 1 of Si, which serves as a light absorber, decreases, and therefore the efficiency of light emission to the outside can be improved.

Sixth Embodiment

Figure 6:
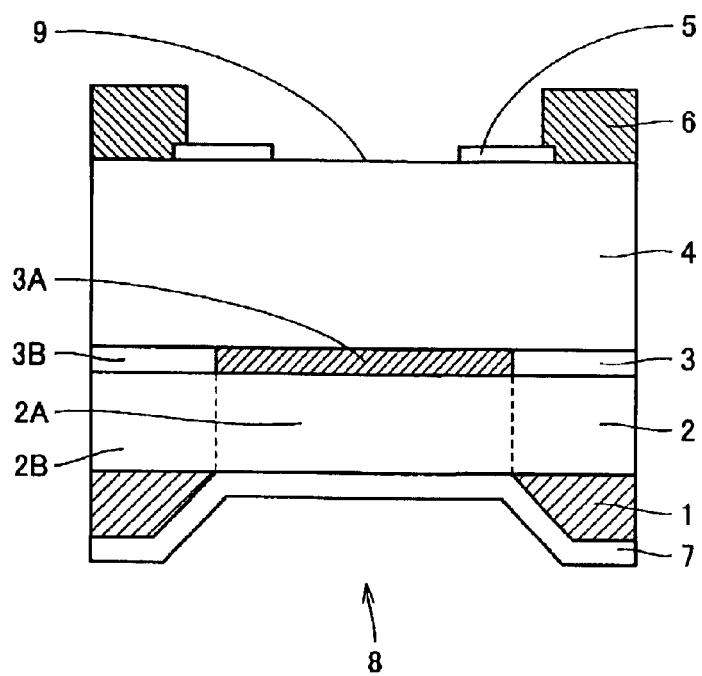

In the structure of the nitride semiconductor light emitting device in accordance with the sixth embodiment shown in FIG. 6, a p type nitride semiconductor layer 2, doped with Mg, a light emitting layer 3 and an n type nitride semiconductor layer 4 are stacked in this order on a non-conductive substrate 1 of Si. Further, the back surface of non-conductive substrate 1 opposite to the surface having the stacked body formed thereon is formed to have a resecced shape. There is an opening 8 where the non-conductive substrate 1 is removed. On surfaces of non-conductive substrate 1 and p type nitride semiconductor layer 2, a p type electrode 7 is formed. Further, an n type light transmitting electrode 5 is formed on the surface of n type nitride semiconductor layer 4. An n type pad electrode 6 is formed at a corner of the surface of n type nitride semiconductor layer 4, and there is an opening 9 where nothing is formed, on the surface of n type nitride semiconductor layer 4.

Referring to FIG. 6, the light emitting device of the present embodiment is also subjected to heat treatment of the stacked body. Therefore, p type semiconductor layer 2 comes to have a region 2A having high concentration and a region 2B having low concentration of Mg doped in P type semiconductor layer 2.

Further, as substrate 1 is non-conductive, the amount of current flowing to region 2A can be larger than the amount of current flowing to region 2B.

Therefore, the current introduced to the light emitting device is concentrated at the light emitting layer 3A positioned on region 2A of p type semiconductor layer, and the current hardly flows to light emitting layer 3B positioned on region 2B. Therefore, the light emitting device can exhibit the current constricting type light emitting characteristic.

Further, in the light emitting device of the present embodiment, there is an opening 9 where nothing is formed, on the surface of n type nitride semiconductor layer 4 as the light emitting surface. Namely, there is a region where the emitted light is not absorbed by n type light transmitting electrode 5. Therefore, the efficiency of light emission to the outside can be improved as compared with the second embodiment.

Further, when the n type light transmitting electrode 5 is not formed in the present embodiment, the efficiency of light emission to the outside can further be improved.

Seventh Embodiment

Figure 7:
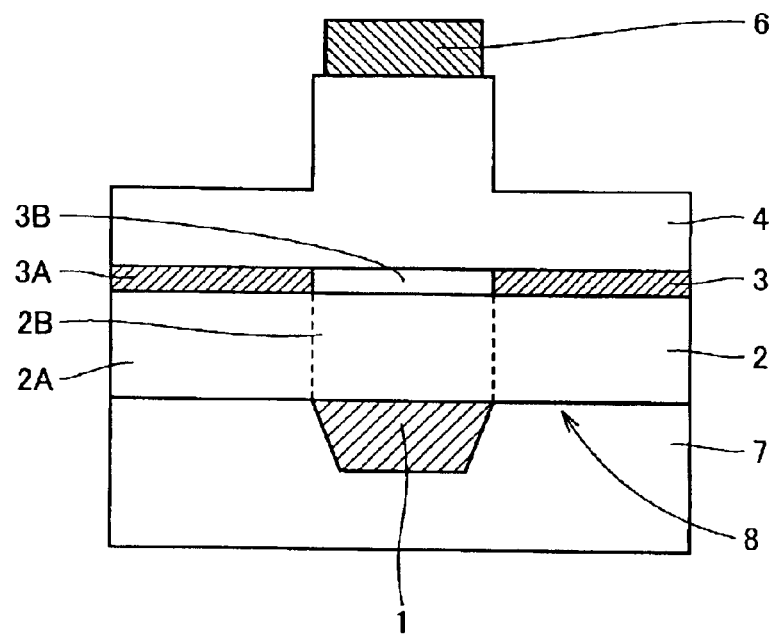

In the structure of the nitride semiconductor light emitting device in accordance with the seventh embodiment shown in FIG. 7, a p type nitride semiconductor layer 2 doped with Mg, a light emitting layer 3 and an n type nitride semiconductor layer 4 are stacked in this order on a non-conductive substrate 1 of Si. A back surface of the non-conductive substrate 1 opposite to the surface having the stacked body formed thereon, the non-conductive substrate 1 is formed to have a protruded shape. There is an opening 8 where the non-conductive substrate 1 is removed. Further, n type nitride semiconductor layer 4 is formed to have a protruded shape, and an n type pad electrode 6 is formed at the top of the protrusion. Further, a p type electrode 7 is formed on surfaces of the protruded non-conductive substrate 1 and p type nitride semiconductor layer 2.

Referring to FIG. 7, the light emitting device in accordance with the present embodiment is also subjected to heat treatment of the stacked body. Therefore, the p type nitride semiconductor layer 2 comes to have a region 2A having high concentration and a region 2B having low concentration of Mg doped in p type nitride semiconductor layer 2.

Further, as substrate 1 is non-conductive, the amount of current flowing to region 2A can be larger than the amount of current flowing to region 2B.

Therefore, the current introduced to the light emitting device is concentrated at light emitting layer 3A positioned on region 2A of p type nitride semiconductor layer, and the current hardly flows to light emitting layer 3B positioned on region 2B. Therefore, the light emitting device can exhibit the current blocking type light emitting characteristic.

Therefore, in the light emitting device of the present embodiment also, light emitting layer 3B positioned above non-conductive substrate 1, which absorbs light emitted from the light emitting device, hardly emits light. Therefore, the amount of light absorbed by non-conductive substrate 1 of Si, which is a light absorber, can be reduced as compared with the prior art, and the efficiency of light emission to the outside of the light emitting device can be improved.

When n type nitride semiconductor layer 4 is formed to have portions other than the protruded portion made thin by dry etching, the efficiency of light emission to the outside of the light emitting device can further be improved.

Eighth Embodiment

Figure 8:
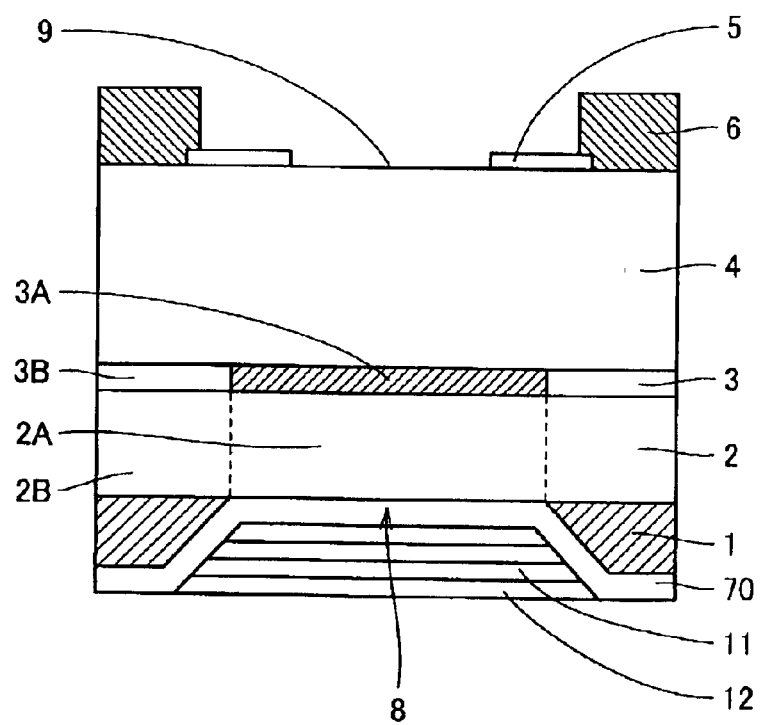

In the structure of the nitride semiconductor light emitting device in accordance with the eighth embodiment shown in FIG. 8, a p type nitride semiconductor layer 2 doped with Mg, a light emitting layer 3 and n type nitride semiconductor layer 4 are stacked in this order on a non-conductive substrate 1 of Si. Further, the back surface of the non-conductive substrate 1 opposite to the surface having the stacked body formed thereon, is formed to have a recessed shape, and there is an opening 8 where non-conductive substrate 1 is removed. On surfaces of non-conductive substrate 1 and p type nitride semiconductor layer 2, a p type light transmitting electrode 70 is formed. Further, on the surface of p type light transmitting electrode 70, a $ZrO_2$ (zirconium oxide) layer 11 and an $SiO_2$ (silicon dioxide) layer 12 as dielectric multi-layered reflecting film is formed. On the surface of n type nitride semiconductor layer 4, an n type light transmitting electrode 5 is formed, and at opposing ends on the surface of n type nitride semiconductor layer 4, n type pad electrodes 6 are formed. There is an opening 9 where nothing is formed, on the remaining surface of n type nitride semiconductor layer 4.

Referring to FIG. 8, the light emitting device of the present embodiment is also subjected to heat treatment of the stacked body. Therefore, p type semiconductor layer 2 comes to have a region 2A having high concentration and a region 2B having low concentration of Mg doped in p type semiconductor layer 2.

Further, as substrate 1 is non-conductive, the amount of current flowing to region 2A can be larger than the amount of current flowing to region 2B.

Therefore, the current introduced to the light emitting device is concentrated at light emitting layer 3A positioned on region 2A of the p type semiconductor layer, and the current hardly flows to light emitting layer 3B positioned on region 2B. Therefore, the light emitting device can exhibit the current constricting type light emission characteristic.

Further, in the present embodiment, the dielectric multi-layered reflecting film is formed of $ZrO_2$ layer 11 and $SiO_2$ layer 12, and the film thickness is an integer multiple of ¼ of the light emission wavelength.

Therefore, in the present embodiment, the light generated near the region of light emitting layer 3A and proceeding to non-conductive substrate 1 passes through p type light emitting electrode 70, is reflected by the dielectric multi-layered reflecting film functioning as a reflective layer formed on the surface of p type light emitting electrode 70, and again proceeds to the inside of the light emitting device. Accordingly, the amount of light that proceeds to non-conductive substrate 1 of Si as a light absorber can be reduced, and hence the amount of light absorbed by non-conductive substrate 1 can be reduced as compared with the prior art. Therefore, the efficiency of light emission to the outside can be improved as compared with the prior art.

Further, similar effects can be attained even when the dielectric multi-layered reflecting film is a semiconductor multi-layered reflecting film.

The materials of the p type nitride semiconductor layer, the light emitting layer and the n type nitride semiconductor layer included in the nitride semiconductor light emitting device of the present invention are not specifically limited. As an example, a nitride semiconductor represented by the expression $In_xAl_yGa_{1-x-y}N$ ($0 \leq x$, $0 \leq y$, $x+y \leq 1$) may be used. As the light emitting layer, an MQW (multiple quantum well) light emitting layer or an SQW (single quantum well) light emitting layer may be used. The dopant used for forming the p type nitride semiconductor layer and a n type nitride semiconductor layer is not specifically limited.

Further, in the present invention, the p type nitride semiconductor layer and the n type nitride semiconductor layer may include a single layer or multiple layers. The space between the layers is not specifically limited. However, an integer multiple of ¼ of the light wavelength is preferred.

In the present invention, the method of stacking the nitride semiconductor layer and the like is not specifically limited. For example, MOCVD method may be used.

Further, in the present invention, the method of removing the substrate is not specifically limited. For example, dry etching method may be used.

In the present invention, materials of the n type electrode and the p type electrode are not specifically limited. Ti, Hf, ITO, $SnO_2$, Ni or Pd or the like may be used for the n type electrode and the p type electrode.

In the present invention, the method of forming the p type electrode and the n type electrode are not specifically limited, and a common method may be used.

In the present embodiment, it is possible to form a pad electrode for wire bonding or the like on the p type electrode, n type electrode, the p type semiconductor layer or on the substrate. The pad electrode is formed of a material such as Au, and formed by the method of vapor deposition, for example. To the pad electrode, a wire of Au or the like for introducing external current, for example, may be bonded.

The device structure of the nitride semiconductor light emitting device of the present invention is applicable to any structure including homostructure, double hetero structure, single hetero structure, or a structure having a quantum well structure in an active layer.

The present invention, a p type nitride semiconductor layer, a light emitting layer and an n type nitride semiconductor layer are stacked on a non-conductive substrate formed of Si or the like, in this order from the side of the non-conductive substrate, whereby current blocking type and current constricted type nitride semiconductor light emitting devices can be fabricated. Therefore, it becomes unnecessary to form an insulator film or the like on the p type nitride semiconductor layer. Thus, crystal defects in the p type nitride semiconductor layer can be reduced as compared with the prior art, and a highly reliable nitride semiconductor light emitting device can be fabricated.

Further, a light reflecting film is provided at a portion where the substrate is removed, so as to direct the light back to the inside of the light emitting device, whereby light can be emitted from a surface different from the substrate surface as the light absorbing body. Therefore, the efficiency of light emission to the outside can be improved as compared with the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting device, comprising:
   a p-type nitride semiconductor layer;
   a light emitting layer;
   an n-type nitride semiconductor layer,
      where these three layers are stacked on an Si (silicon) substrate in this order from the side of the Si substrate;
      where Si substrate is partially removed to expose a part of the p-type nitride semiconductor layer, and on the exposed region of the p-type nitride semiconductor layer, a p-type electrode is formed.

2. The nitride semiconductor light emitting device according to claim 1, wherein
   said p type nitride semiconductor layer includes a region having high dopant concentration and a region having low dopant concentration, wherein the region having high dopant concentration and the region having low dopant concentration are positioned laterally with respect to each other.

3. The nitride semiconductor light emitting device according to claim 1, wherein
   a backside of said Si substrate opposite to the surface having the stack formed thereon is partially removed to have a recessed shape, and at the removed region, a surface of said p type nitride semiconductor layer is exposed.

4. A nitride semiconductor light emitting device comprising a p type nitride semiconductor layer, a light emitting layer and an n type nitride semiconductor layer stacked on an Si (silicon) substrate in this order from the side of the Si substrate, wherein said Si substrate is partially removed to expose a part of the p type nitride semiconductor layer, and on the exposed region of the p type nitride semiconductor layer, a p type electrode is formed, wherein
   a backside of said Si substrate opposing to the surface having the stack formed thereon is partially removed to have a protruded shape, and at the removed region, a surface of said p type nitride semiconductor layer is exposed.

5. The nitride semiconductor light emitting device according to claim 1, wherein
   a region of the p type nitride semiconductor above the region where said Si substrate is removed has dopant concentration higher than that of other regions of the p type nitride semiconductor layer, wherein the region having higher dopant concentration and the other regions are positioned laterally with respect to each other.

6. The nitride semiconductor light emitting device according to claim 1, wherein
   an n type pad electrode is formed at a corner of a surface of the n type nitride semiconductor layer stacked above said Si substrate.

7. A nitride semiconductor light emitting device comprising a p type nitride semiconductor layer, a light emitting layer and a n type nitride semiconductor layer stacked on an Si(silicon) substrate in this order from the side of the Si substrate, wherein said Si substrate is partially removed to expose a part of the p type nitride semiconductor layer, and on the exposed region of then type nitride semiconductor layer, a p type electrode is formed wherein
   a reflective film is formed at a recessed portion where said Si substrate is partially removed.

8. A nitride semiconductor light emitting device comprising a p type nitride semiconductor layer, a light emitting layer and an n type nitride semiconductor layer stacked on an Si (silicon) substrate an this order from the side of the Si substrate, wherein said Si substrate is partially removed to expose a part of the p type nitride semiconductor layer, and on the exposed region of the p type nitride semiconductor layer, a p type electrode is formed, wherein said Si substrate is partially removed to have a protruded shape, and said n type nitride semiconductor layer is formed to have a protruded shape.

9. The nitride semiconductor light emitting device according to claim 8, wherein an n type pad electrode or an n type pad electrode and an n type light transmitting electrode are formed at a top portion of the protrusion of said n type nitride semiconductor layer.

10. A nitride semiconductor light emitting device comprising a p type nitride semiconductor layer, a light emitting layer and an n type nitride semiconductor layer stacked on an Si (silicon) substrate in this order from the side of the Si substrate, wherein said Si substrate is partially removed to expose a part of the p type nitride semiconductor layer, and on the exposed region of the p type nitride semiconductor layer, a p type electrode is formed, wherein said Si substrate is non-conductive and non light-transmitting.

11. A nitride semiconductor light emitting device, comprising a p type nitride semiconductor layer, a light emitting layer and an n type nitride semiconductor layer stacked on an Si (silicon) substrate in this order from the side of the Si substrate, wherein said Si substrate is partially removed to expose a part of the p type nitride semiconductor layer, and on the exposed region of the p type nitride semiconductor layer, a p type electrode is formed, wherein a region of the p type nitride semiconductor layer above said Si substrate has higher resistivity than the resistivity of another region of the p type nitride semiconductor layer.

12. A nitride semiconductor light emitting device, comprising a p type nitride semiconductor layer, a light emitting layer and an n type nitride semiconductor layer stacked on an Si (silicon) substrate in this order from the side of the Si substrate, wherein said Si substrate is partially removed to expose a part of the p type nitride semiconductor layer, and on the exposed region of the p type nitride semiconductor layer, a p type electrode is formed, wherein a region of the p type nitride semiconductor layer corresponding to an opening where said Si substrate is removed has lower resistivity than the resistivity of another region of the p type nitride semiconductor layer.

\* \* \* \* \*